(12) United States Patent
Mao et al.

(10) Patent No.: US 6,790,735 B2
(45) Date of Patent: Sep. 14, 2004

(54) METHOD OF FORMING SOURCE/DRAIN REGIONS IN SEMICONDUCTOR DEVICES

(75) Inventors: Hui-Min Mao, Tainan Hsien (TW); Sheng-Tsung Chen, Tainan (TW); Yi-Nan Chen, Taipei (TW); Bo-Ching Jiang, Hualien (TW); Chih-Yuan Hsiao, Taipei (TW)

(73) Assignee: Nanya Technology Corporation, Taoyuan (TW)

( * ) Notice: Subject to any disclaimer, the term of this patent is extended or adjusted under 35 U.S.C. 154(b) by 0 days.

(21) Appl. No.: 10/449,297

(22) Filed: May 29, 2003

(65) Prior Publication Data
US 2004/0092074 A1 May 13, 2004

(30) Foreign Application Priority Data
Nov. 7, 2002 (TW) ........................................ 91132754 A

(51) Int. Cl.[7] .................... H01L 21/336; H01L 21/8234
(52) U.S. Cl. ........................ 438/305; 438/306; 438/275
(58) Field of Search ................................ 438/305, 306, 438/303, 595, 241, 258, 275

(56) References Cited
U.S. PATENT DOCUMENTS

| | | | | |
|---|---|---|---|---|
| 5,719,425 A | * | 2/1998 | Akram et al. ............... | 257/344 |
| 6,316,302 B1 | * | 11/2001 | Cheek et al. ............... | 438/199 |
| 6,339,237 B1 | * | 1/2002 | Nomachi et al. ........... | 257/282 |
| 6,342,419 B1 | * | 1/2002 | Tu .............................. | 438/253 |
| 6,350,696 B1 | * | 2/2002 | Shields et al. .............. | 438/704 |
| 6,448,618 B1 | * | 9/2002 | Inaba et al. ................. | 257/391 |
| 6,455,362 B1 | * | 9/2002 | Tran et al. .................. | 438/194 |

* cited by examiner

Primary Examiner—Michael Trinh
(74) Attorney, Agent, or Firm—Quintero Law Office

(57) ABSTRACT

A method of forming source/drain regions in semiconductor devices. First, a substrate having at least one gate structure is provided. Next, first, second, and third insulating spacers are successively formed over the sidewall of the gate structure. Subsequently, ion implantation is performed on the substrate on both sides of the gate structure using the third insulating spacer as a mask to form first doping regions. After the third insulating spacer is removed, ion implantation is performed on the substrate on both sides of the gate structure using the second insulating spacer as a mask to form second doping regions serving as source/drain regions with the first doping regions. Finally, after the second insulating spacer is removed, ion implantation is performed on the substrate on both sides of the gate structure using the first insulating spacer as a mask to form third doping regions, thereby preventing punchthrough.

27 Claims, 7 Drawing Sheets

METHOD OF FORMING SOURCE/DRAIN REGIONS IN SEMICONDUCTOR DEVICES

BACKGROUND OF THE INVENTION

1. Field of the Invention

The invention relates to a semiconductor process, and more particularly to a method of forming source/drain regions in semiconductor devices using multiple spacers.

2. Description of the Related Art

In general, memory devices, such as dynamic random access memory (DRAM), have many source/drain devices, for example, MOS transistor. In the conventional fabrication of the transistor for memory device, after the gate is formed on a semiconductor substrate, such as a silicon substrate, ion implantation is performed on the substrate to form source/drain regions. However, with increased integration of integrated circuits (ICs), the size of transistors must be reduced. Unfortunately, when the channel length of the transistors is less than 2 $\mu$m, hot carrier effect, short channel effect, and punchthrough, well known issues between the source and drain regions, can degrade reliability. In other words, the electrical properties of MOS transistors significantly influence the performance of memory devices. In order to improve these problems, lightly doped drain (LDD) method and anti-punchthrough implantation, such as pocket implanting, are usually adopted in the conventional fabrication of transistors.

Such memory devices typically include a memory array region and a memory peripheral region (support or logic region). Each region includes source/drain devices, such as MOS transistors. In general, when the line space (the distance between gates) on the memory peripheral region is larger (about 1~2 $\mu$m), the LDD implantation and anti-punchthrough implantation can be finished easily due to a larger process window for lithography. However, with increased integration of ICs the gate line width is shrunk less than 0.2 $\mu$m and the gate line space is shrunk less than 0.4 $\mu$m. Therefore, the fabrication of LDD and pocket implantation regions becomes more difficult due to the limitation of lithography.

SUMMARY OF THE INVENTION

Accordingly, an object of the invention is to provide a novel and simple method of forming source/drain regions in a semiconductor device to adjust the dimension of the doping regions using three stacked spacers as masks, thereby forming the required doping regions.

According to one aspect, the invention provides a method of forming source/drain regions in a semiconductor device. First, a substrate having at least one gate structure covered by a capping layer is provided. Next, first, second, and third insulating spacers are successively formed over the sidewall of the gate structure. Subsequently, ion implantation is performed on the substrate on both sides of the gate structure using the capping layer and the third insulating spacer as masks to form first doping regions. After the third insulating spacer is removed, ion implantation is performed on the substrate on both sides of the gate structure using the capping layer and the second insulating spacer as masks to form second doping regions serving as source/drain regions with the first doping regions. Finally, after the second insulating spacer is removed, ion implantation is performed on the substrate on both sides of the gate structure using the capping layer and the first insulating spacer as masks to form third doping regions, thereby preventing punchthrough.

The capping layer and the first insulating spacer can be silicon nitride. The second insulating spacer can be high-density plasma (HDP) oxide, and the third insulating spacer can be silicon oxide formed by tetraethyl orthosilicate (TEOS). Moreover, the third and second insulating spacers are removed by buffer oxide etch solution (BOE), and the proportional volume of ammonium fluoric ($NH_4F$) to hydrofluoric (HF) acid in BOE is about 8~50:1.

Moreover, the first doping regions are doped by arsenic. The second doping regions are doped by phosphorus. The third doping regions are doped by boron.

DESCRIPTION OF THE DRAWINGS

For a better understanding of the present invention, reference is made to a detailed description to be read in conjunction with the accompanying drawings, in which.

DETAILED DESCRIPTION OF THE INVENTION

A preferred embodiment of the present invention is now described with reference to FIGS. 1 through 7.

Figure 1:
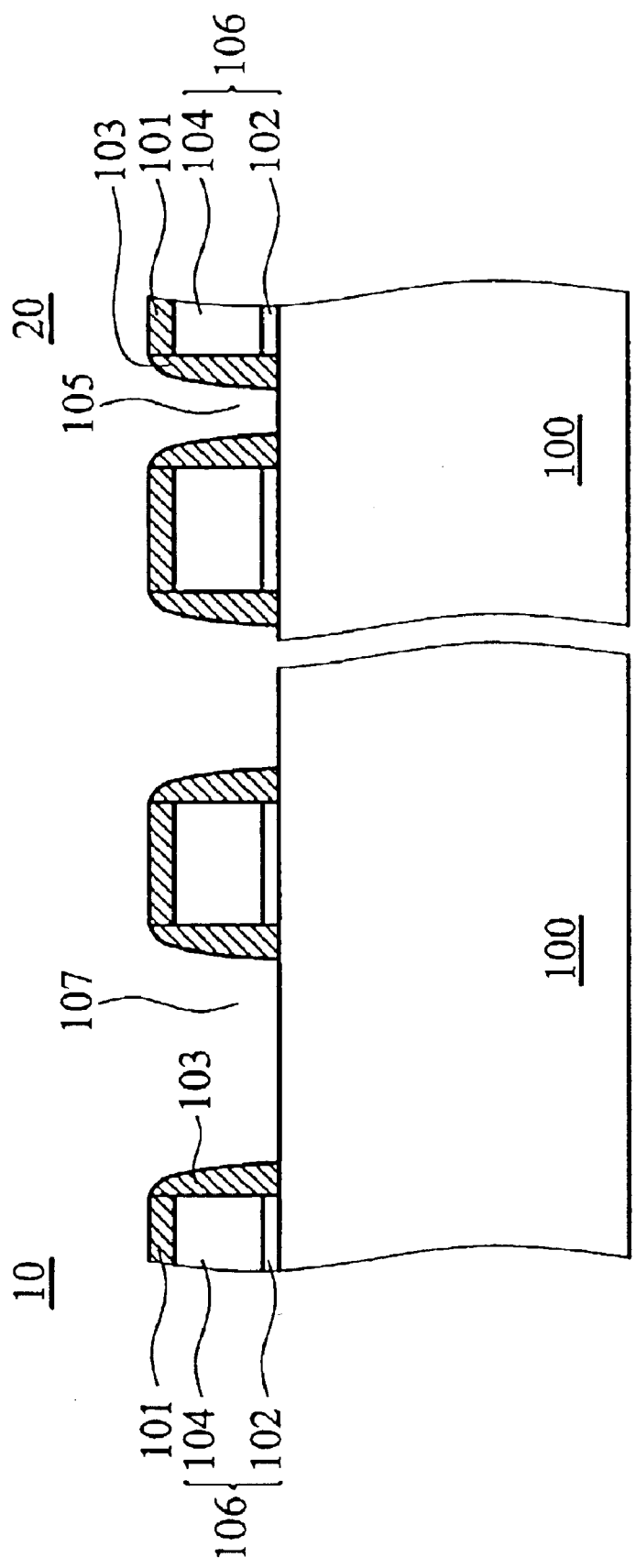
FIGS. 1 to 7 are cross-sections showing a method of forming source/drain regions in a memory peripheral device according to the present invention.

First, in FIG. 1, a substrate 100, such as a p-type silicon substrate, is provided to fabricate a semiconductor device, for example, DRAM, SRAM or other memory devices. A memory peripheral region 10 and a memory array region 20 are defined on the substrate 100. Next, gate structures 106 are formed on these regions 10 and 20. The gate structure 106 includes a gate dielectric layer 102 and a gate electrode 104. The gate structure 106 in this invention, for example, a silicon oxide layer (not shown) is formed on the substrate 100 by thermal oxidation. Next, a conductive layer (not shown), such as polysilicon, is deposited on the silicon oxide layer. An insulating layer (not shown), such as silicon nitride, is then deposited on the conductive layer. Thereafter, lithography and etching are performed on the insulating layer, the conductive layer, and the silicon oxide layer to form the gate structure 106. The patterned insulating layer 101 is used as a capping layer. The patterned conductive layer 104 is used as a gate electrode, and the patterned silicon oxide layer 102 is used as a gate dielectric layer, the gate line space (gap) 107 on the memory peripheral region 10 is typically larger than the gate line space 105 on the memory array region 20.

In addition, the method for forming lightly doped drain (LDD) region in the substrate according to the present invention is different from the conventional method. After the gate structures 106 are completed, ion implantation is not immediately performed to form LDD regions or source/drain regions in the substrate 100, but a plurality of first insulating spacers 103, such as silicon nitride, having a thickness of about 100~150 Å, are formed over each sidewall of the gate structures 106 serving as masks for subsequent ion implantation. This is because the doping regions close to the gates may induce short channel effect (SCE) and hot carrier effect (HCE) when the gate width is first insulating spacers 103 are formed before ion implantation is performed, thereby increasing the distance between the doping regions and gates 104.

Figure 2:
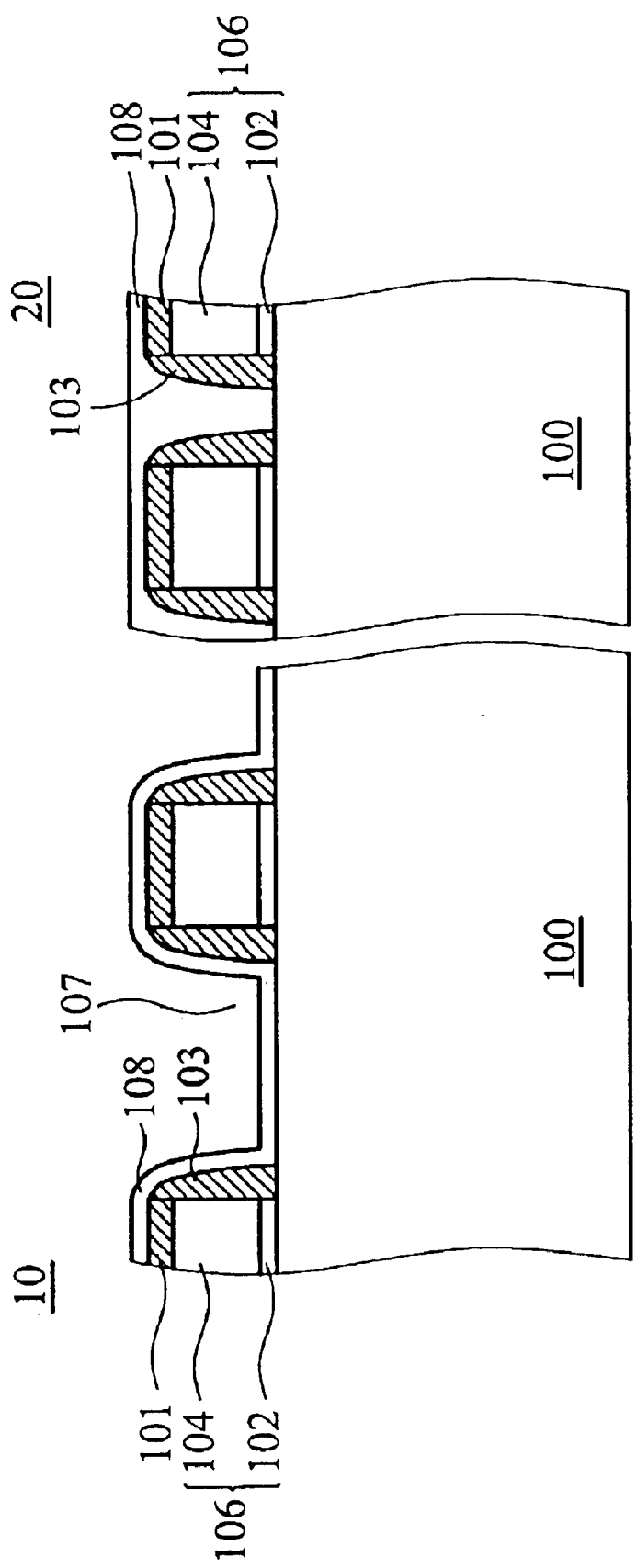

Subsequently, in FIG. 2, an insulating layer 108 is conformably deposited over the capping layers 101 and the surface of the gate line spaces 107 on the memory peripheral region 10 and is deposited over the capping layers 101 on the memory array region 20 and fills the gate line spaces 105 by conventional deposition, such as chemical vapor deposition (CVD). This is because the gate line space 107 is larger than the gate line space 105, In this invention, the insulating layer 108 has a thickness of about 50~200 Å, which can be silicon oxide and formed by high-density plasma CVD (HDPCVD).

Figure 3:
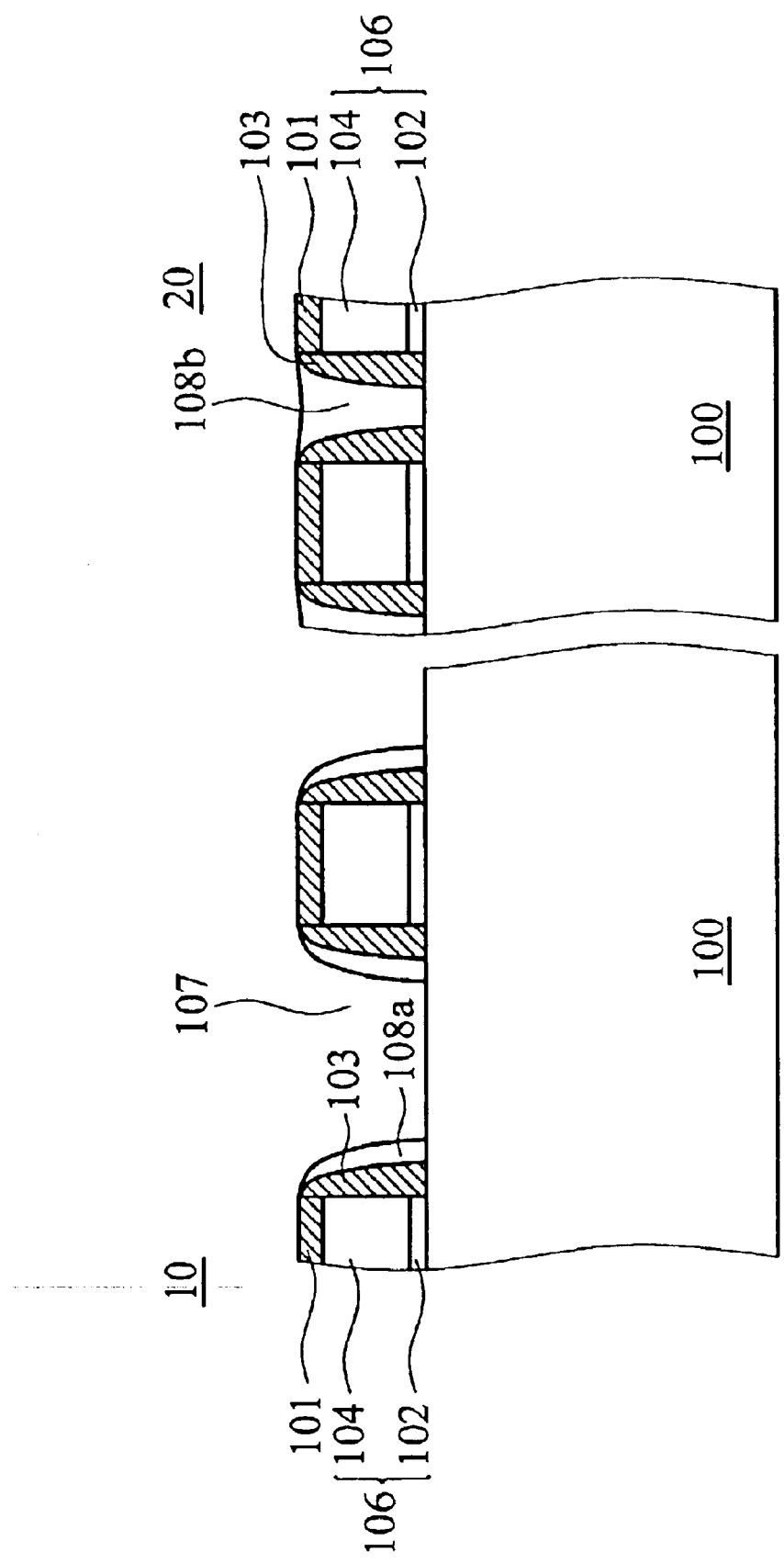

Next, in FIG. 3, anisotropic etching, such as reactive ion etching is (RIE), is performed to removed the insulating layer 108 from the capping layers 101 and the bottom of the gate line spaces 107, thereby forming a plurality of second insulating spacers 108a over the first insulating spacers 103 on the memory peripheral region 10 and forming insulating plugs 108b in each gate line space 105 on the memory array region 20.

Figure 4:
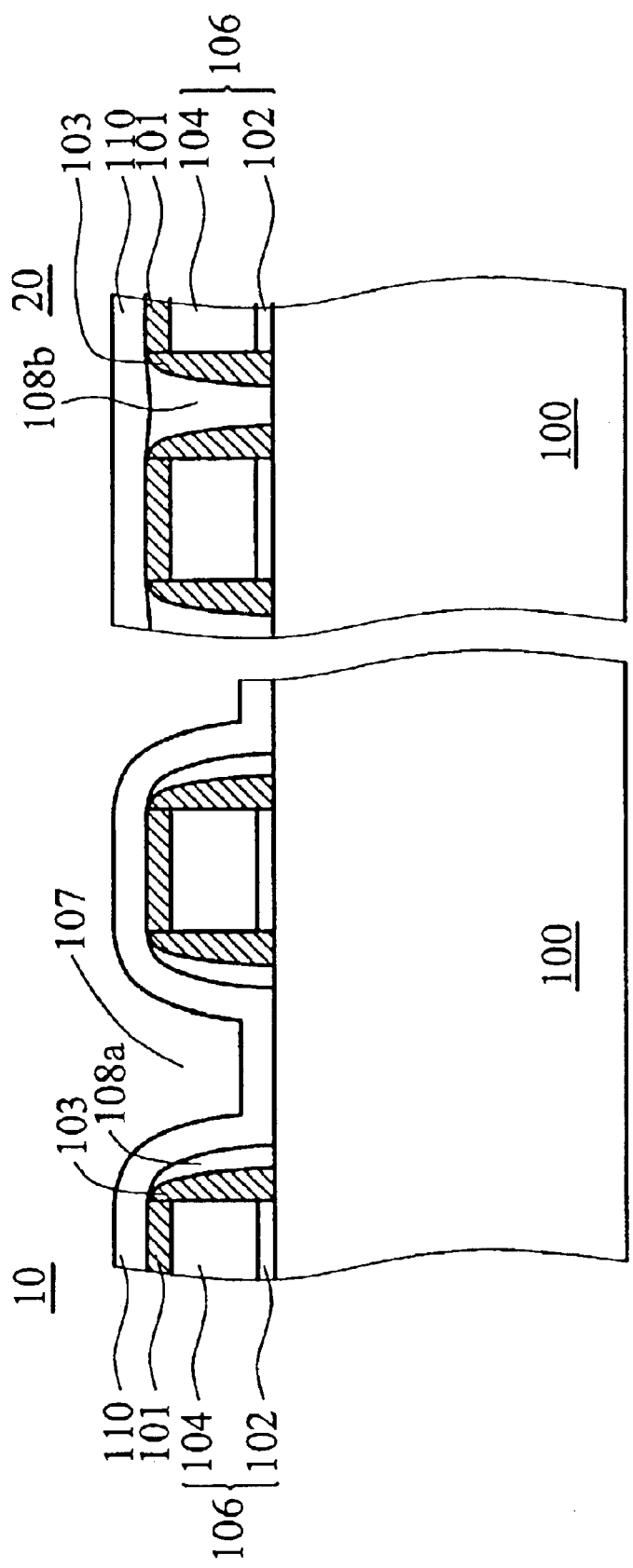

Next, in FIG. 4, an insulating layer 110 is conformably deposited over the capping layers 101 and the surface of the gate line spaces 107 on the memory peripheral region 10 and over the capping layers 101 and the insulating plug 108b on the memory array region 20 by conventional deposition, such as CVD. In this invention, the insulating layer 110 has a thickness of about 1500~1600 Å, which can be silicon oxide and formed by tetraethyl orthosilicate (TEOS) using plasma-enhanced CVD (PEPCVD).

Figure 5:
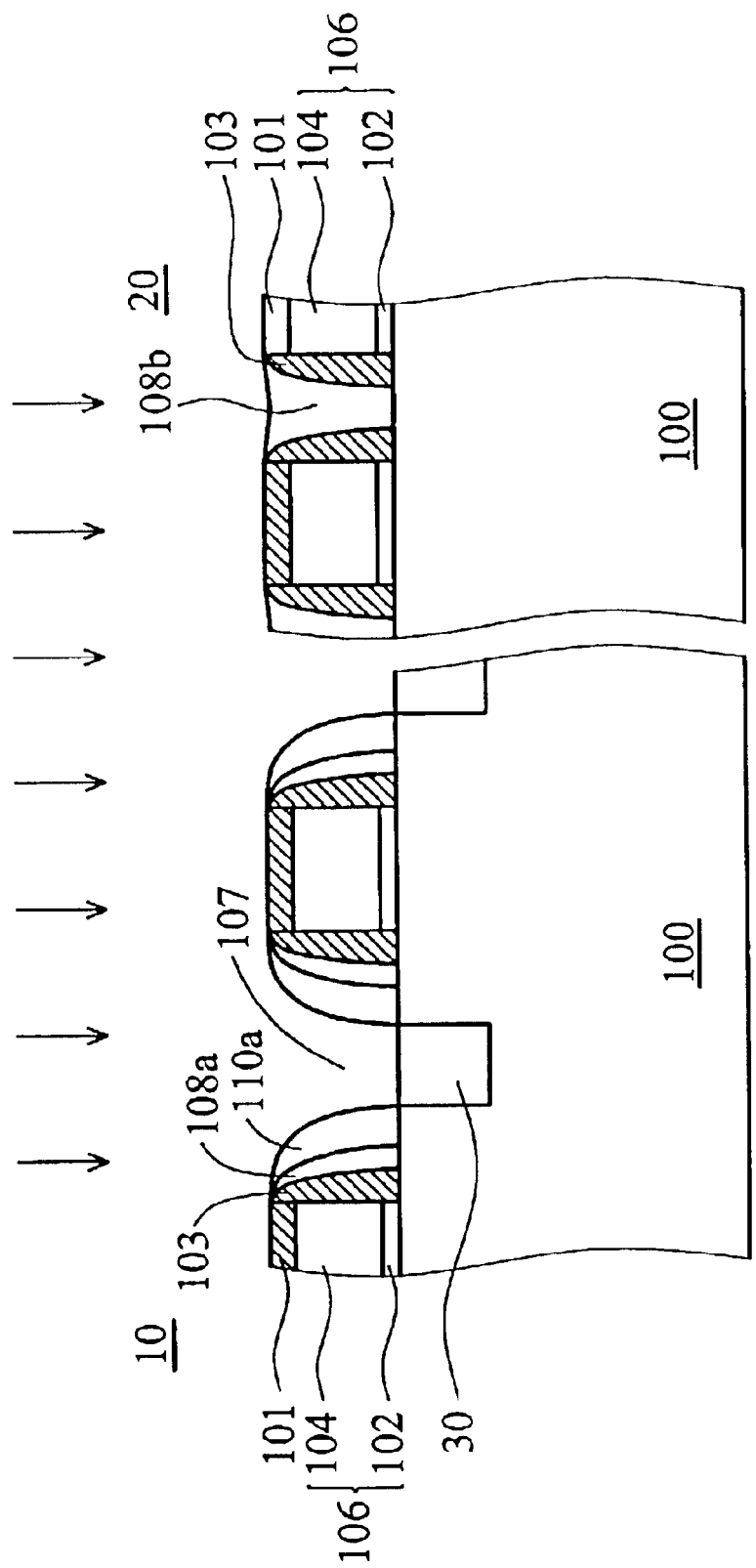

Next, in FIG. 5, anisotropic etching, such as RIE, is performed to remove the insulating layer 110 from the capping layers 101 and the bottom of the gate line spaces 107, thereby forming a plurality of third insulating spacers 110a over the second insulating spacers 108a on the memory peripheral region 10 and exposing the insulating plugs 108b in the gate line spaces 105 on the memory array region 20.

Thereafter, ion implantation is performed on the substrate 100 using the capping layers 101, the third insulating spacers 110a, and the insulating plugs 108b as masks to form first doping regions 30 in the substrate 100 on both sides of the gate structures 106 on the memory peripheral region 10. In this invention, the energy and dosage for this ion implantation are 55 KeV and $1 \times 10^{15}$ atom/cm$^2$, respectively. Moreover, the first doping regions 30 can be doped by arsenic.

Figure 6:
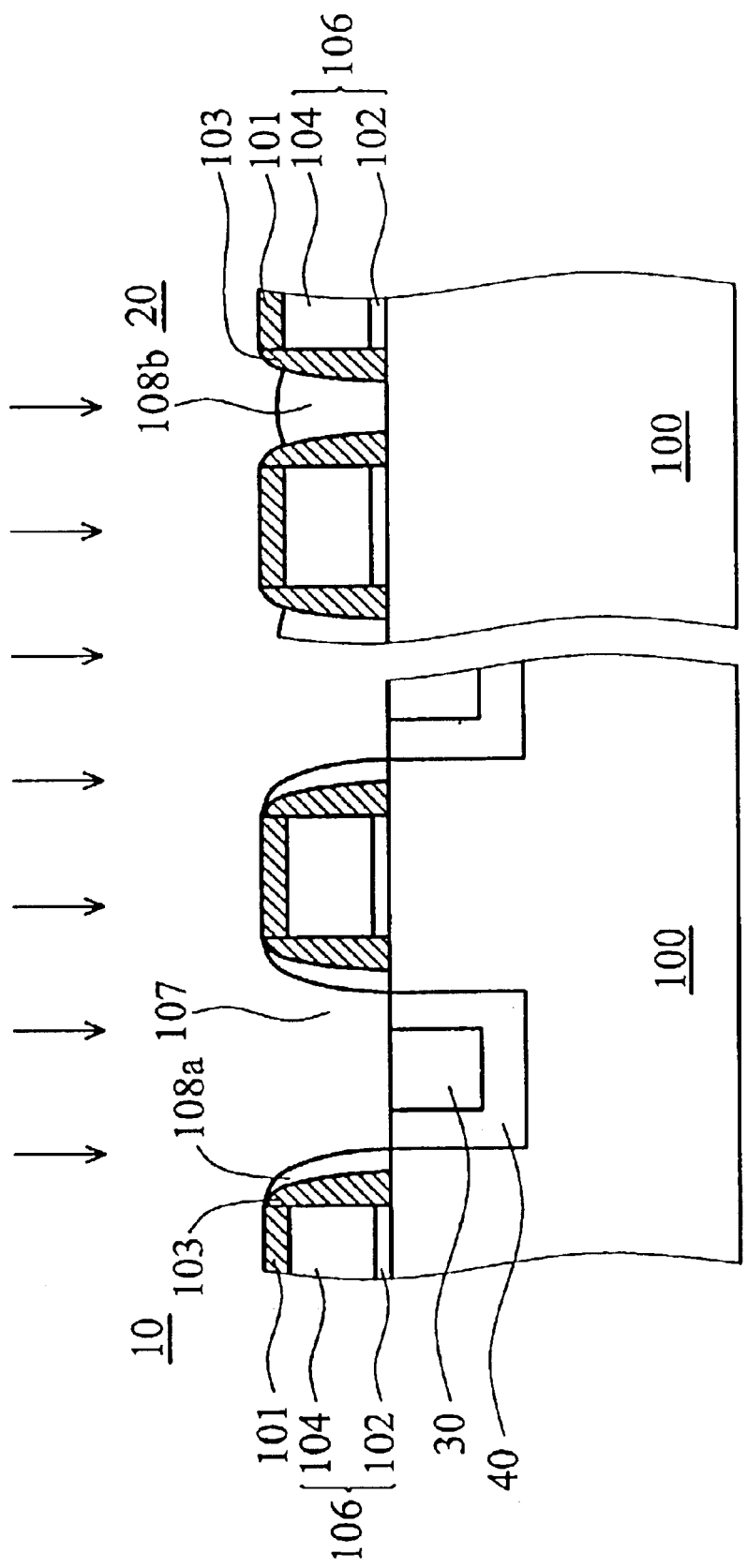

Next, in FIG. 6, the third insulating spacers 110a are removed by suitable solution. In this invention, the third insulating spacers 110a can be removed by buffer oxide etch solution (BOE), wherein the proportional volume of ammonium fluoric (NH$_4$F) to hydrofluoric (HF) acid in BOE is about 8~50:1. The etching rate of TEOS oxide by BOE (about 12000 Å/min) is higher than HDP oxide (about 300 Å/min). Accordingly, the second insulating spacers 108a composed of HDP oxide can serve as etching stop when the third insulating spacers 110a composed of TEOS oxide are removed. Moreover, only some of each insulating plug 108b composed of HDP oxide is etched, as shown in FIG. 6.

Thereafter, ion implantation is performed on the substrate 100 using the capping layers 101, the second insulating spacers 108a, and the insulating plugs 108b as masks to form second doping regions 40 in the substrate 100 on both sides of the gate structures 106 on the memory peripheral region 10. In this invention, the second doping regions 40 fully contain the first doping regions 30 and serve as source/drain regions with the first doping regions 30. In addition, the energy and dosage for this ion implantation are 30 KeV and $2 \times 10^{13}$ atom/cm$^2$, respectively. Moreover, the second doping regions 40 can be doped by phosphorus and serve as lightly doped drain (LDD) regions to prevent hot carrier effect and short channel effect.

Figure 7:
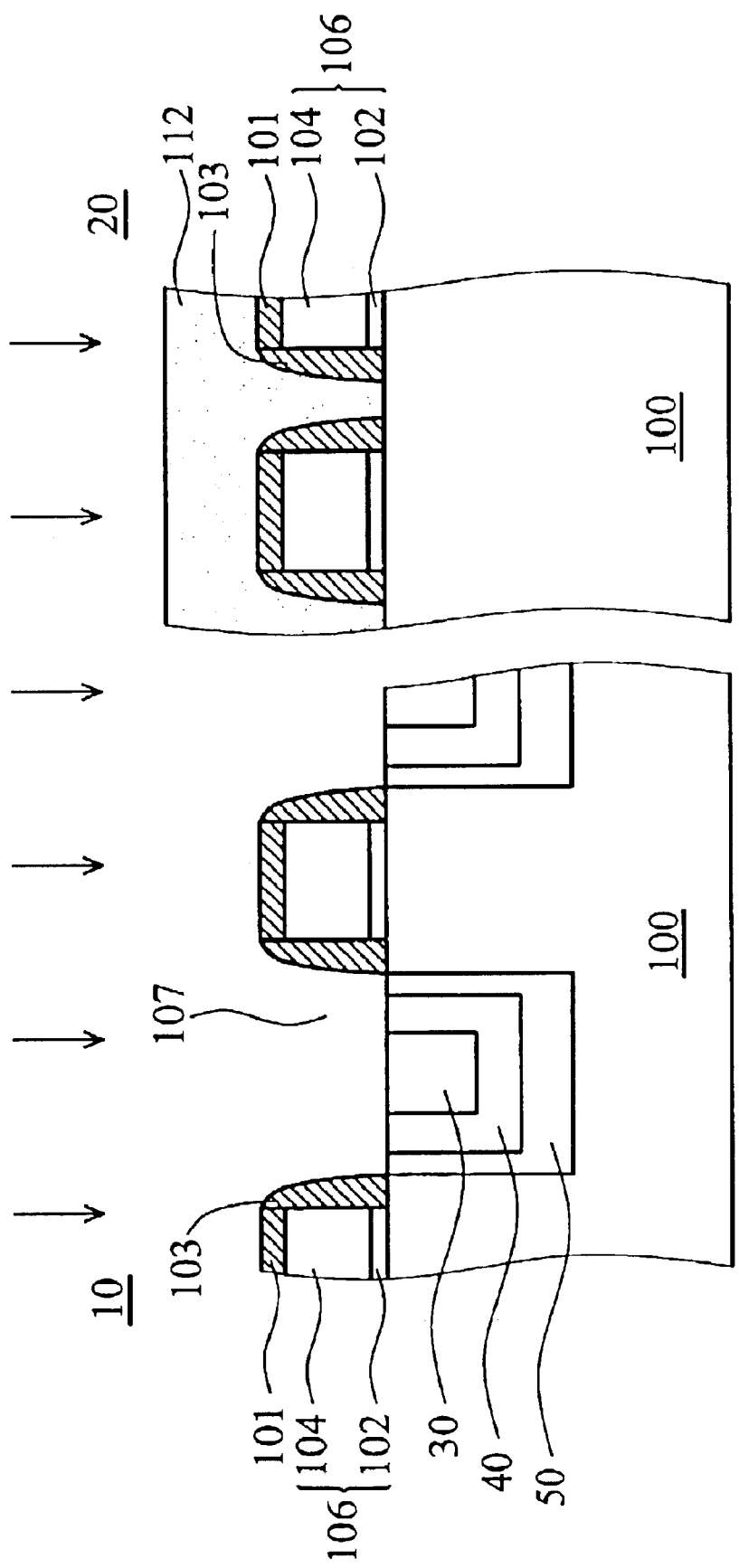

Finally, in FIG. 7, the second insulating spacers 108a and the insulating plugs 108b can be removed by BOE. In this invention, the proportional volume of NH$_4$F to HF in BOE is about 8~50:1. The etching rate of HDP oxide by BOE is higher than silicon nitride (about 4 Å/min). Accordingly, the first insulating spacers 103 and the capping layers 101 can serve as etching stop when the second insulating spacers 108a composed of HDP oxide are removed. Subsequently, a photoresist layer 112 is formed on the capping layers 101 on the memory array regions 20 and fills the gate line spaces 105.

Thereafter, ion implantation (pocket implanting), is performed on the substrate 100 using the capping layers 101 and the first insulating spacers 103 on the memory peripheral region 10 and the photoresist layer 112 on the memory array region 20 as masks to form third doping regions 50 in the substrate 100 on both sides of the gate structures 106 on the memory peripheral region 10. In this invention, the third doping regions 40 fully contain the first and second doping regions 30 and 40 and serve as pocket implanting regions, thereby preventing punchthrough. In addition, the energy and dosage for this ion implantation are 80 KeV and $9 \times 10^{12}$ atom/cm$^2$, respectively. Moreover, the third doping regions 40 can be doped by boron.

According to the invention, the required doping regions can be formed by adjusting the dimension of the doping regions using three stacked spacers. Therefore, the LDD regions and pocket implanting regions can still be formed without the limitation of lithography when the gate line spaces on the memory peripheral region are reduced due to increasing the integration. That is, short channel effect, hot carrier effect, or punchthrough issues can still be prevented by source/regions having LDD regions and pocket implanting regions.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A method of forming source and drain regions in a semiconductor device, comprising:

providing a substrate having at least one gate structure covered by a capping layer; forming first, second, and third insulating spacers successively over the sidewall of the gate structure;

performing ion implantation on the substrate on both sides of the gate structure using the capping layer and the third insulating spacer as masks to form first doping regions;

removing the third insulating spacer;

performing ion implantation an the substrate on both sides of the gate structure using the capping layer and the second insulating spacer as masks to form second doping regions fully enclosing the first doping regions;

removing the second insulating spacer; and performing ion implantation on the substrate on both sides of the gate structure using the capping layer and the first insulating spacer as masks to form third doping regions fully enclosing the first and second doping regions.

2. The method as claimed in claim 1, wherein the gate structure is composed of a gate electrode and a gate dielectric.

3. The method as claimed in claim 1, wherein the capping layer is silicon nitride.

4. The method as claimed in claim 1, wherein the third insulating spacer is silicon oxide formed by tetraethyl orthosilicate (TEOS).

5. The method as claimed in claim 4, wherein the third insulating spacer has a thickness of about 1500~1600 Å.

6. The method as claimed in claim 4, wherein the third insulating spacer is removed by buffer oxide etch solution (BOE).

7. The method as claimed in claim 6, wherein the proportional volume of ammonium fluoric ($NH_4F$) to hydrofluoric (HF) acid in BOE is about 8~50:1.

8. The method as claimed in claim 1, wherein the second insulating spacer is high-density plasma (HDP) oxide.

9. The method as claimed in claim 8, wherein the second insulating spacer has a thickness of about 50~200 Å.

10. The method as claimed in claim 9, wherein the second insulating spacer is removed by BOE.

11. The method as claimed in claim 10, wherein the proportional volume of $NH_4F$ to HF in BOE is about 8~50:1.

12. The method as claimed in claim 1, wherein the first insulating spacer is silicon nitride.

13. The method as claimed in claim 12, wherein the first insulating layer has a thickness of about 100~150 Å.

14. The method as claimed in claim 1, wherein the first doping regions are doped by arsenic.

15. The method as claimed in claim 1, wherein the second doping regions are doped by phosphorus.

16. The method as claimed in claim 1, wherein the third doping regions are doped by boron.

17. A method of forming source and drain regions in a memory peripheral device, comprising:
   providing a substrate having a memory peripheral region;
   forming a plurality of gate structures on the peripheral region, each covered by a capping layer;
   forming first, second, and third insulating spacers successively over the sidewall of each gate structure;
   performing ion implantation on the substrate on both sides of each gate structure using the capping layers and the third insulating spacers as masks to form first doping regions; removing the third insulating spacers;
   performing ion implantation on the substrate on both sides of the gate structure using the capping layers and the second insulating spacers as masks to form second doping regions fully containing the first doping regions;
   removing the second insulating spacers; and
   performing ion implantation on the substrate on both sides of each gate structure using the capping layers and the first insulating spacers as masks to form third doping regions fully containing the first and second doping regions.

18. The method as claimed in claim 17, wherein the gate structure is composed of a gate electrode and a gate dielectric.

19. The method as claimed in claim 17, wherein the capping layer is silicon nitride.

20. The method as claimed in claim 17, wherein the third insulating spacer is TEOS oxide and has a thickness of about 1500~1600 Å.

21. The method as claimed in claim 17, wherein the second insulating spacer is HDP oxide and has a thickness of about 50~200 Å.

22. The method as claimed in claim 17, wherein the first insulating spacer is silicon nitride and has a thickness of about 100~150 Å.

23. The method as claimed in claim 17, wherein the first doping regions are doped by arsenic.

24. The method as claimed in claim 17, wherein the second doping regions are doped by phosphorus.

25. The method as claimed in claim 17, wherein the third doping regions are doped by boron.

26. The method as claimed in claim 17, wherein the second and third insulating spacers are removed by BOE.

27. The method as claimed in claim 26, wherein the proportional volume of $NH_4F$ to HF in BOE is about 8~50:1.

* * * * *